(12) United States Patent
Hsu

(10) Patent No.: US 9,730,328 B2
(45) Date of Patent: *Aug. 8, 2017

(54) PRINTED CIRCUIT BOARD WITH EMBEDDED COMPONENT AND METHOD FOR MANUFACTURING SAME

(71) Applicants: Qi Ding Technology Qinhuangdao Co., Ltd., Qinhuangdao (CN); Zhen Ding Technology Co., Ltd., Tayuan, Taoyuan (TW)

(72) Inventor: Shih-Ping Hsu, Taoyuan (TW)

(73) Assignees: Qi Ding Technology Qinhuangdao Co., Ltd., Qinhuangdao (CN); Zhen Ding Technology Co., Ltd., Tayuan, Taoyuan (TW)

( * ) Notice: Subject to any disclaimer, the term of this patent is extended or adjusted under 35 U.S.C. 154(b) by 92 days.

This patent is subject to a terminal disclaimer.

(21) Appl. No.: 14/138,126

(22) Filed: Dec. 23, 2013

(65) Prior Publication Data
US 2014/0185257 A1    Jul. 3, 2014

(30) Foreign Application Priority Data
Dec. 27, 2012    (CN) .......................... 2012 1 05775464

(51) Int. Cl.
H05K 1/18        (2006.01)
H05K 3/46        (2006.01)

(52) U.S. Cl.
CPC ........... H05K 1/186 (2013.01); H05K 3/4697 (2013.01); H05K 3/4602 (2013.01);
(Continued)

(58) Field of Classification Search
CPC ...... H05K 3/284; H05K 7/142; H05K 1/0306; H05K 1/0231; H01L 2924/01079;
(Continued)

(56) References Cited

U.S. PATENT DOCUMENTS 7,350,296 B2 *    4/2008    Ryu ....................... H05K 1/185
                                                                174/260
7,855,894 B2 *  12/2010    Inagaki ................. H01G 4/224
                                                                174/260
(Continued)

FOREIGN PATENT DOCUMENTS

TW        201023708 A1 * 12/2008    ............... H05K 3/46
TW        201023708           6/2010

*Primary Examiner* — Tuan T Dinh
(74) *Attorney, Agent, or Firm* — Steven Reiss

(57) ABSTRACT

A printed circuit board with embedded component includes a double-sided printed circuit board, an electronic component, a plurality of conductive paste blocks, an insulating layer and a wiring layer near the first wiring layer, an insulating layer and a wiring layer near the second wiring layer. The double-sided printed circuit board comprising a first wiring layer, a base, and a second wiring layer. The first wiring layer and the second wiring layer are arranged on opposite sides of the base. The second wiring layer includes a plurality of electrical contact pads. The base defines a number of conductive vias. Each electrical contact pad is aligned with and electrically connected to one corresponding conductive via. The conductive paste blocks are electrically connecting to the conductive vias. The electronic component is electrically connected to the conductive paste blocks. The two insulating layers cover the electronic component and the second wiring layer.

4 Claims, 16 Drawing Sheets

(52) U.S. Cl.
CPC ............ *H05K 2201/096* (2013.01); *H05K 2201/09072* (2013.01); *H05K 2201/09563* (2013.01); *H05K 2201/10636* (2013.01); *Y02P 70/611* (2015.11); *Y10T 29/49139* (2015.01)

(58) Field of Classification Search
CPC . H01L 2924/01078; H01L 2224/48091; H01L 2924/00; H01L 2224/97; H01L 2924/00014; H01L 2924/066; H01L 2224/2919; H01L 2224/48227; H01L 2224/49171; H01L 2224/85; H01L 2924/181; H01L 2224/0401; H01L 2224/81; H01L 2224/83; H01L 2924/0001
USPC ........ 361/748, 750, 760–763, 766, 782–784, 361/790, 795, 812; 257/773, 723–730; 174/259–264
See application file for complete search history.

(56) References Cited

U.S. PATENT DOCUMENTS

| | | | |
|---|---|---|---|
| 7,969,745 B2* | 6/2011 | Hsu | H01L 23/50 |
| | | | 174/255 |
| 2006/0032668 A1* | 2/2006 | Wakihara | H05K 1/0269 |
| | | | 174/260 |
| 2007/0195511 A1* | 8/2007 | Imamura | H05K 1/186 |
| | | | 361/761 |
| 2009/0309212 A1* | 12/2009 | Shim | H01L 21/568 |
| | | | 257/700 |
| 2010/0230822 A1* | 9/2010 | Pagaila | H01L 21/565 |
| | | | 257/773 |
| 2010/0301468 A1* | 12/2010 | Watanabe | H01L 23/16 |
| | | | 257/692 |

* cited by examiner

PRINTED CIRCUIT BOARD WITH EMBEDDED COMPONENT AND METHOD FOR MANUFACTURING SAME

BACKGROUND

1. Technical Field

The present disclosure generally relates to printed circuit boards (PCBs), and particularly relates to a printed circuit board with embedded component and a method for manufacturing the printed circuit board with embedded component.

2. Description of Related Art

To accommodate development of miniaturized electronic products with multiple functions, printed circuit boards with embedded component are widely used.

A method of manufacturing the printed circuit board with embedded component includes following steps. A through hole is defined in a circuit board. A supporting material layer is formed at a side of the circuit board. The supporting material layer covers the through hole. An electronic component is arranged in the through hole, and is fixed on the supporting material layer. A first adhesive layer is laminated on the other side of the circuit board, such that the electronic component is adhered to the first adhesive layer. The supporting material layer is removed from the circuit substrate, and a second adhesive sheet is laminated on the circuit substrate, such that the circuit substrate is sandwiched between the first adhesive sheet and the second adhesive sheet, and the electronic component is adhered on the second adhesive sheet. In addition, a first copper layer and a second copper layer respectively laminated onto the first adhesive sheet and the second adhesive. Therefore, the first copper layer and the second copper layer respectively are converted into a first wiring layer and a second wiring layer, and a plurality of conductive vias are defined by laser drilling process and electroplating process, such that the first wiring layer is electrically connected to electrodes of the electronic component through the conductive vias. Therefore, a first solder mask and a second solder mask are respectively formed on the first wiring layer and the second wiring layer, thereby a printed circuit board with embedded component is obtained. In the above method, the alignment accuracy between the conductive vias and the electronic component is not better.

What is needed therefore is a printed circuit board with embedded component, and a method for manufacturing the printed circuit board with embedded component to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

A method for manufacturing a printed circuit board with embedded component according to a first embodiment includes the following steps.

Figure 1:
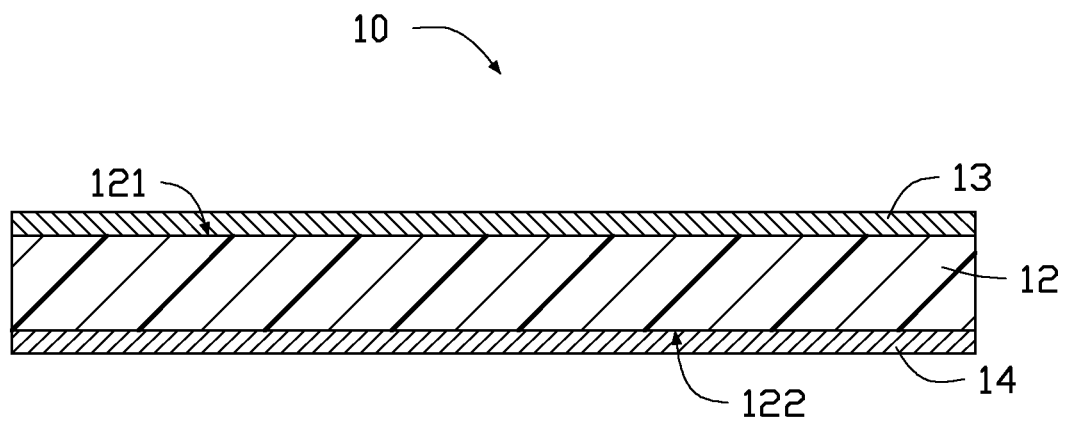
FIG. 1 shows a double-sided copper clad lamination according to a first embodiment.
Figure 2:
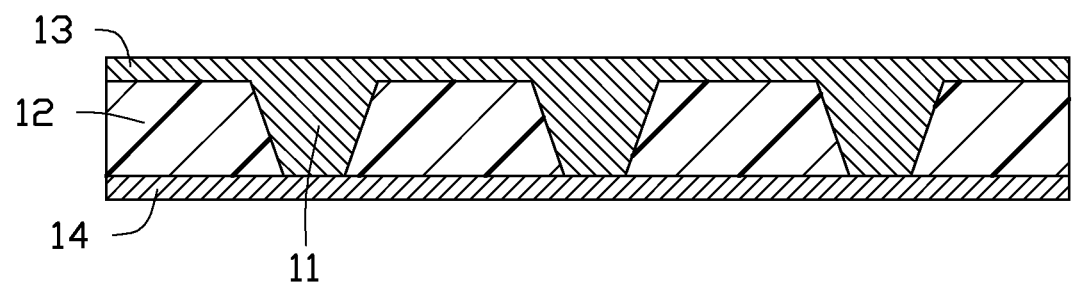
FIG. 2 shows a plurality of conductive vias formed in the double-sided copper clad lamination of FIG. 1.
Figure 3:
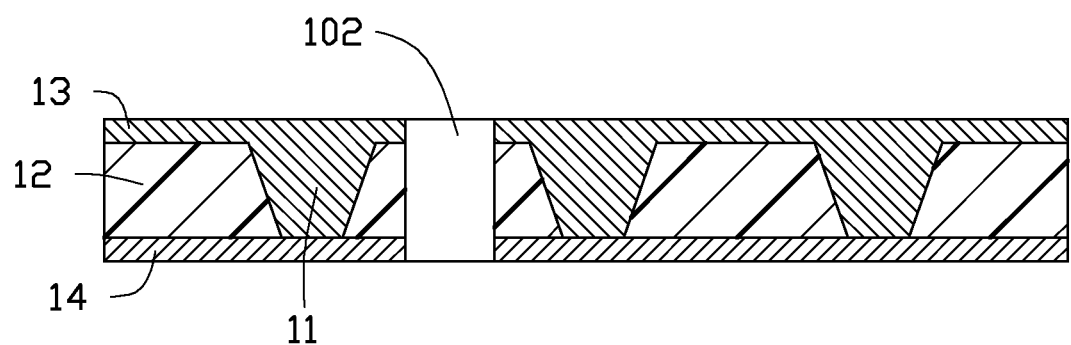
FIG. 3 shows a plurality of filling through holes defined in the double-sided copper clad lamination of FIG. 2.
Figure 4:
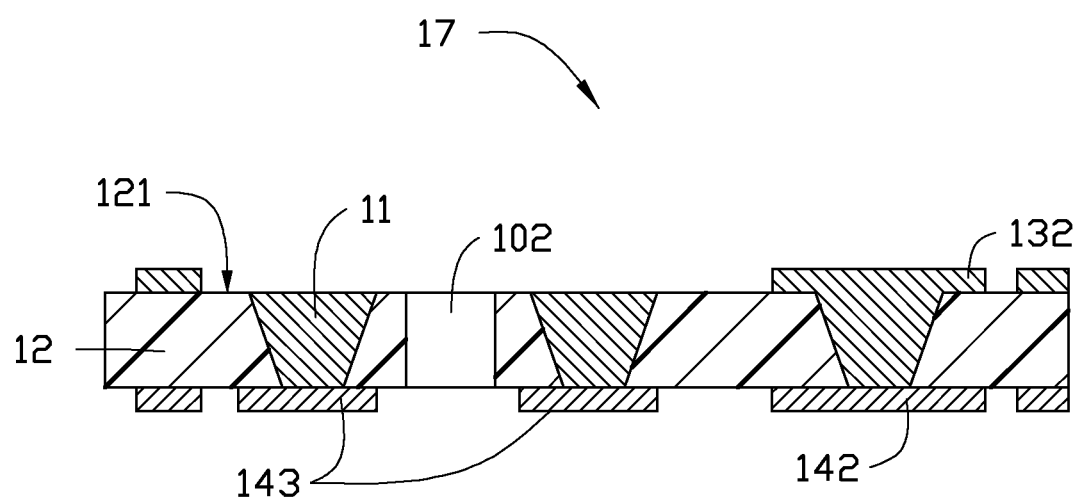
FIG. 4 shows copper layers converted by the copper layers in FIG. 3.

FIGS. 1&2 show that in step (1), a double-sided copper clad lamination 10 is provided. A plurality of first conductive vias 11 is formed in the double-sided copper clad lamination.

In the present embodiment, the double-sided copper clad lamination 10 includes a base 12, a first copper layer 13, and a second copper layer 14. The base 12 is an insulating base. The base 12 includes a first surface 121 and a second surface 122 opposite to the first surface 121. The first copper layer 13 is arranged on the first surface 121. The second copper layer 14 is arranged on the second surface 122. The first conductive vias 11 are blind holes which pass through the first copper layer 13 and the base 12. The first conductive vias 11 are formed by a mechanical drilling or a laser drilling process and then by an electroplating or a via filling process. In other embodiments, the first conductive vias 11 are defined to pass through the first copper layer 13, the base 12 and the second copper layer 14. The first copper layer 13 is electrically connected to the second copper layer 14 through the first conductive vias 11. In the present embodiment, the number of the first conductive vias 11 is six. In other embodiment, the number of the first conductive vias 11 can be two, three, four, five or more than six.

FIGS. 3-6 show that in step 2, a filling through hole 102 or a plurality of through holes 102 is defined to pass through the first copper layer 13, the base 12 and the second copper layer 14. A first wiring layer 132 is formed by selectively etching the first copper layer 13 and a second wiring layer 142 is formed by selectively etching the second copper layer 14. Accordingly, a double-sided printed circuit board 17 is obtained.

The second wiring layer 142 includes a plurality of electrical contact pads 143. In the present embodiment, the number of the electrical contact pads 143 is six which is same as that of the first conductive vias 11. Each of the electrical contact pads 143 is aligned with and electrically connected to one first conductive via 11. In the present embodiment, the end of the first conductive via 11, which is adjacent to the first surface 121, is coplanar with the first surface 121. In other embodiment, the end of the first conductive via 11, which is adjacent to the first surface 121, can be at a lower level than the first surface 121. The first conductive vias 11 are divided into two rows. The filling through hole 102 is arranged between the two rows of the first conductive vias 11. The number of the through holes 102 may be one (see FIG. 5), two (see FIG. 6) or more than two. The shape of the through holes 102 may be circle, oval, rectangle, polygon, or irregular shape.

Figure 7:
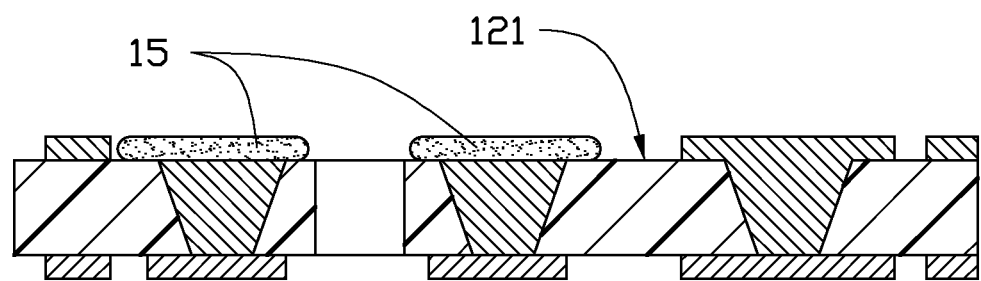
FIG. 7 shows conductive paste blocks formed on the double-sided copper clad lamination of FIG. 4.
Figure 8:
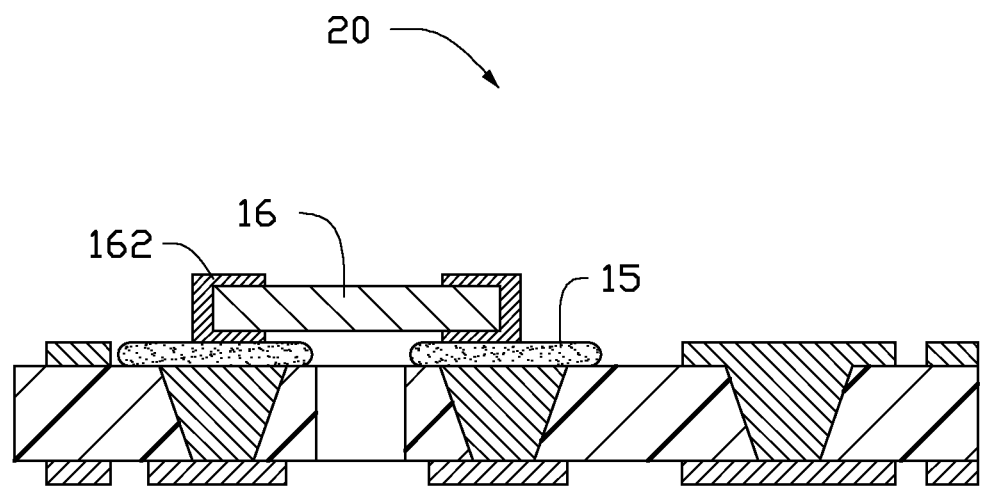
FIG. 8 shows an electronic component electrically connected to the conductive paste blocks in FIG. 6 to obtain a multilayer substrate.

FIGS. 7-8 show that, in step 3, a plurality of conductive paste blocks 15 is formed on the first surface 121. Each conductive pastes block 15 is aligned with one corresponding electrical contact pad 143. Each of the conductive paste blocks 15 covers and is electrically connected to one end of the first conductive via 11 electrically connected to the corresponding electrical contact pad 14. A plurality of electronic components 16 is provided, and each electronic component 16 is aligned with a pair of the first conductive via 11. The electronic components 16 are adhered with and electrically connected to the corresponding conductive paste blocks 15. Accordingly, a multilayer substrate 20 is obtained.

In the present embodiment, the electronic components 16 may be passive elements or active elements, (e.g. chips, resistors, or capacitors) which include two electrodes 162. When the electronic component 16 is arranged on the conductive paste blocks 15, the two electrodes 162 are respectively fixed and connected to the corresponding two conductive paste blocks 15. The material of the conductive paste blocks 15 can be conductive solder paste, conductive silver paste, or conductive copper paste, for example.

Figure 9:
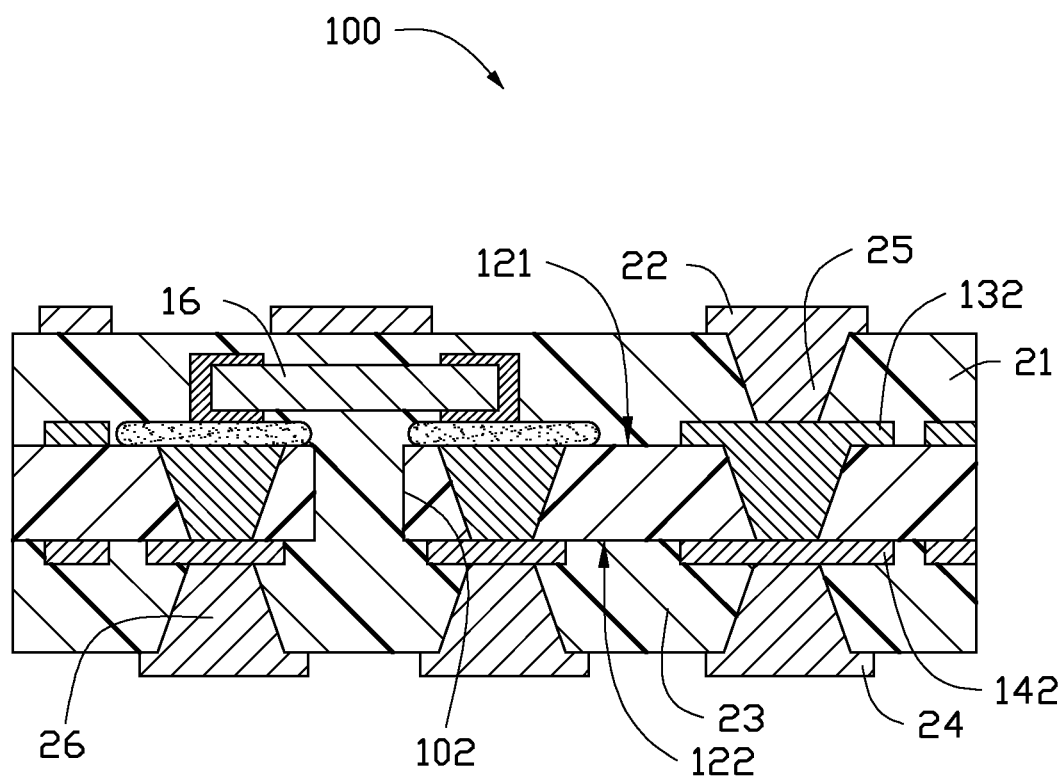
FIG. 9 shows insulating layers and circuit layers formed on the opposite side of the multilayer substrate of FIG. 8 to obtain a printed circuit board with embedded component.

FIG. 9 shows that in step 4, a first insulating layer 21 and a third wiring layer 22 are formed on the first wiring layer 132 of the multilayer substrate 20 in described order. A second insulating layer 23 and a fourth wiring layer 24 are formed on the second wiring layer 142 of the multilayer substrate 20 in described order. Accordingly, a printed circuit board with embedded component 100 is obtained.

The following steps may be used to form the first insulating layer 21, the third wiring layer 22, the second insulating layer 23, and the fourth wiring layer 24.

First, a third copper layer (not shown), the first insulating layer 21, the multilayer substrate 20, the second insulating layer 23, and a fourth copper layer (not shown) are stacked, and laminated onto each other to form a main body.

The first insulating layer 21 and the second insulating layer 23 usually are adhesive sheets, e.g. FR4 epoxy glass cloth half-cured adhesive sheets. After lamination, the first insulating layer 21 covers the first wiring layer 132, exposed portions of the first surface 121, lateral surfaces of the electronic components 16 and top surfaces of the electronic components 16 opposite to the first surface 121, therefore, the electronic components 16 are embedded in the first insulating layer 21. The second insulating layer 23 covers the second wiring layer 142 and exposed portions of the second surface 122, and enters into sides of the electronic components 16 adjacent to the first surface 121 through the filling through hole 102, and fills into gaps between the electronic components 16 and the first surface 121. After the lamination is completed, the second insulating layer 23 fully fills the filling through hole 102 and the gaps between the electronic components 16 and the first surface 121.

Second, a plurality of second conductive vias 25 are formed in the first insulating layer 21, a plurality of third conductive vias 26 are formed in the second insulating layer 23, and the third copper layer and the fourth copper layer are respectively converted into the third wiring layer 22 and the fourth wiring layer 24. The third wiring layer 22 is electrically connected to the first wiring layer 132 by the second conductive vias 25. The fourth wiring layer 24 is electrically connected to the second wiring layer 142 by the third conductive vias 26. The steps of forming the second conductive vias 25 and the third conductive vias 26 may be processed before the steps of forming the third wiring layer 22 and the fourth wiring layer 24. The second conductive vias 25 and the third conductive vias 26 may be formed by a mechanical drilling or a laser drilling process and then by an electroplating or a via filling process. The via filling process may be a plating process, or a copper paste filling process, or a silver paste filling process. The third wiring layer 22 and the fourth wiring layer 24 may be formed by an image transfer process and an etching process.

There may be two or more wiring layers formed at the side of the third wiring layer 32, and there may be two or more wiring layers formed at the side of the fourth wiring layer 24.

The printed circuit board with embedded component 100 includes the multilayer substrate 20, the first insulating layer 21, the third wiring layer 22, the second insulating layer 23, and the fourth wiring layer 24. The multilayer substrate 20 includes the base 12, the first wiring layer 132, the second wiring layer 142, and the electronic components 16. The base 12 is sandwiched between the first wiring layer 132 and the second wiring layer 142. The base 12 has the first surface 121, and the second surface 122 opposite to the first surface 121. The first wiring layer 132 is formed on the first surface 121. The second wiring layer 142 is formed on the second surface 122. The second wiring layer 142 includes the electrical contact pads 143. The first conductive vias 11 and the filling through hole 102 are defined in the base 12. Each electrical contact pad 143 is electrically connected to one first conductive via 11. The ends of the first conductive vias 11 adjacent to the first surface 121 are coplanar with or lower than the first surface 121. The filling through hole 102 passes through the first wiring layer 132, the base 12 and the second wiring layer 142, and is located between the first conductive vias 11. The printed circuit board with embedded component 100 further includes the conductive paste blocks 15 spatially corresponding to the electrical contact pads 143. Each conductive paste block 15 contacts with, and is electrically connected to the end of the corresponding first conductive via 11. The electronic component 16 is electrically connected to the first conductive vias 11 by the conductive paste blocks 15, such that the electronic component 16 is electrically connected to the electrical contact pads 143. In the present embodiment, the electronic component 16 includes two electrodes 162, and there are two electrical contact pads 143, and two conductive paste blocks 15. Each electrode 162 is adhered to one conductive paste block 15. The second insulating layer 21 is formed on the first wiring layer 132. The first insulating layer 21 covers the first wiring layer 132, exposed portions of the first surface 121, lateral surfaces of the electronic components 16 and top surfaces of the electronic components 16 opposite to the first surface 121, therefore, the electronic components 16 are embedded in the first insulating layer 21. The third wiring layer 22 is formed on the surface of the first insulating layer 21 further away from the first surface 121, and is electrically connected to the first wiring layer 132 through the second conductive vias 25. The second insulating layer 23 is formed on the second wiring layer 142, covering a plurality of portions of the second wiring layer 142 to expose the other portions of the second wiring layer 142, and fully filling the filling through hole 102 and the gaps between the electronic components 16 and the first surface 121. The fourth wiring layer 24 is formed on the surface of the second insulating layer 23 further away from the second surface 122.

It is understood that the number of the electronic components 16 may be more than or less than 3. In such case, the number of the conductive paste blocks 15, the number of the electrical contact pads 143, and the number of the first conductive vias 11 should be changed to match with the number of the electronic components 16.

FIGS. 10-16 show that, a method for manufacturing a printed circuit board with embedded component according to a second embodiment includes the following steps.

Figure 10:
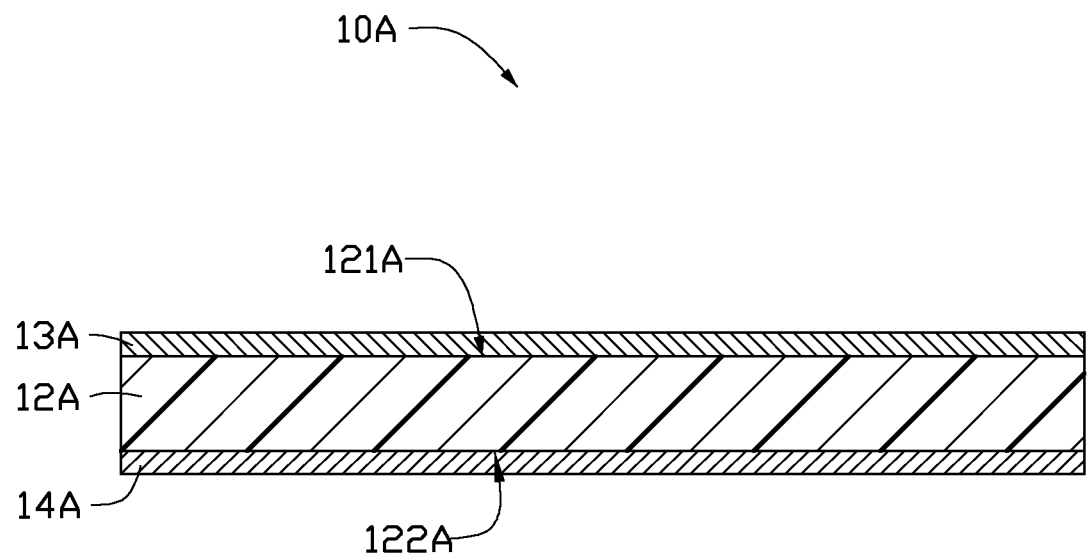
FIG. 10 shows a double-sided copper clad lamination according to a second embodiment.
Figure 11:
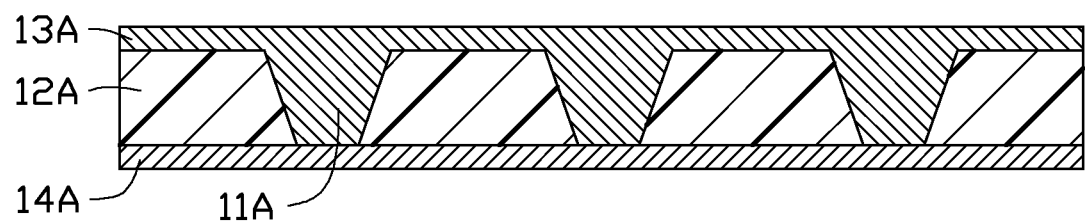
FIG. 11 shows a plurality of conductive vias formed in the double-sided copper clad lamination of FIG. 10.

FIGS. 10-11 show that in step (1), a double-sided copper clad lamination 10A is provided. A plurality of first conductive vias 11A is formed in the double-sided copper clad lamination.

In the present embodiment, the double-sided copper clad lamination 10A includes a base 12A, a first copper layer 13A, and a second copper layer 14A. The base 12A includes a first surface 121A and a second surface 122A opposite to the first surface 121A. The first copper layer 13A is arranged on the first surface 121A. The second copper layer 14A is arranged on the second surface 122A. The first conductive vias 11A are blind holes pass through the first copper layer 13A and the base 12A. The first conductive vias 11A are formed by a mechanical drilling or a laser drilling process and then by a electroplating or a via filling process. In the present embodiment, the number of the first conductive vias 11A is six. In other embodiment, the number of the first conductive vias 11A may be two, three, four, five or more than six.

Figure 12:
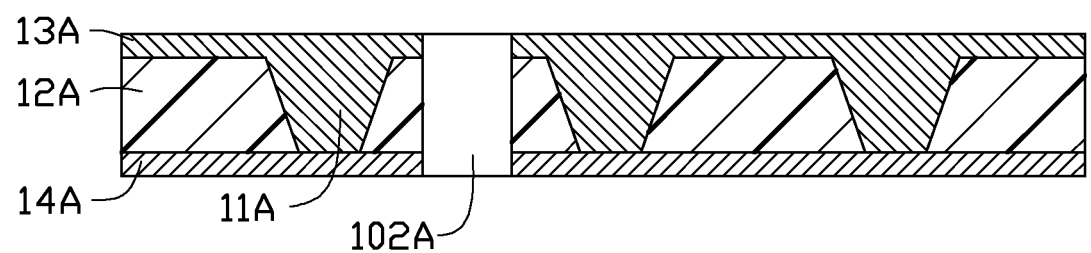
FIG. 12 shows a plurality of filling through holes defined in the double-sided copper clad lamination of FIG. 11.
Figure 13:
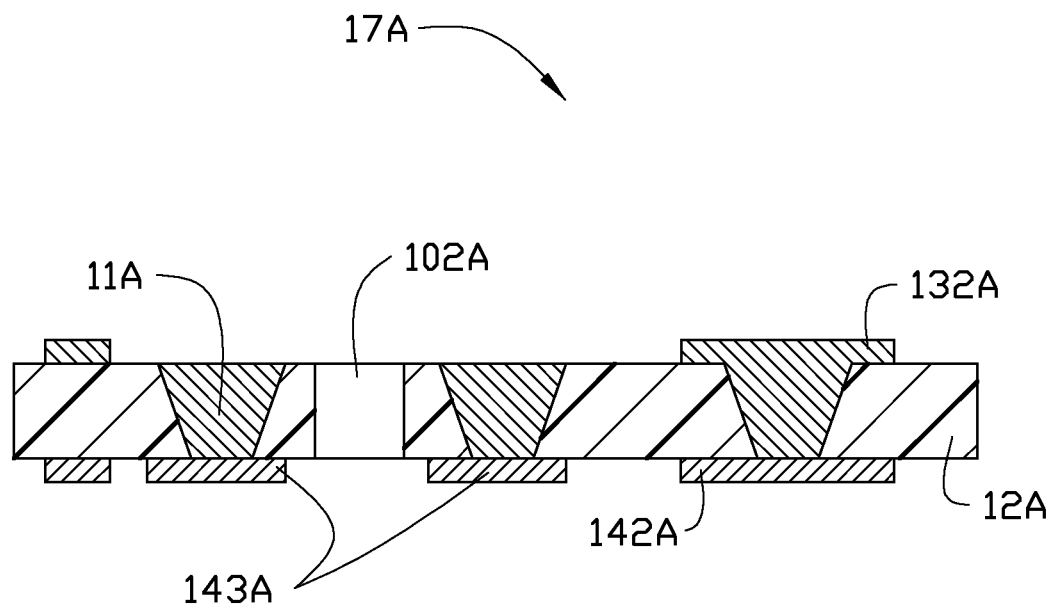
FIG. 13 shows copper layers converted by the copper layers in FIG. 12.

FIGS. 12-13 show that in step 2, a filling through hole 102A or a plurality of through holes 102A is defined to pass through the first copper layer 13A, the base 12A and the second copper layer 14A. A first wiring layer 132A is formed by selectively etching the first copper layer 13A and a second wiring layer 142A is formed by selectively etching the third copper layer 14A.

The second wiring layer 142A includes a plurality of electrical contact pads 143A. In the present embodiment, the number of the electrical contact pads 143A is six which is same as that of the first conductive vias 11A. Each of the electrical contact pads 143A is aligned with and electrically connected to one first conductive via 11A. The first copper layer 13A faced to the first conductive vias 11A is etched, such that the end of the first conductive via 11A, which is adjacent to the first surface 121A, is coplanar with the first surface 121A. In other embodiment, the end of the first conductive via 11A, which is adjacent to the first surface 121A, may be lower than the first surface 121A.

Figure 5:
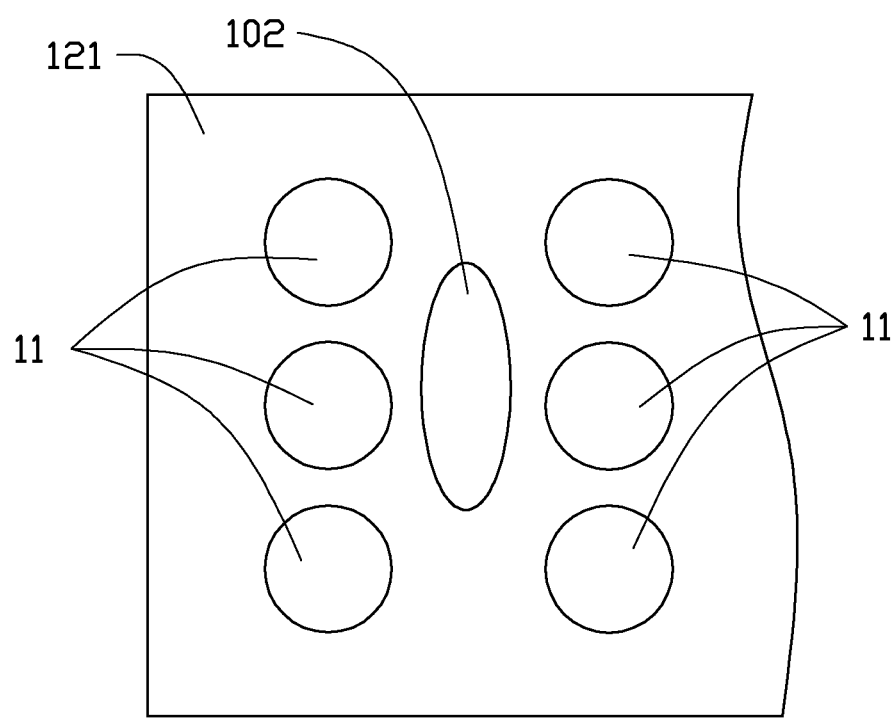
FIGS. 5&6 are plan views of the double-sided copper clad lamination according to two exemplary embodiments.
Figure 6:
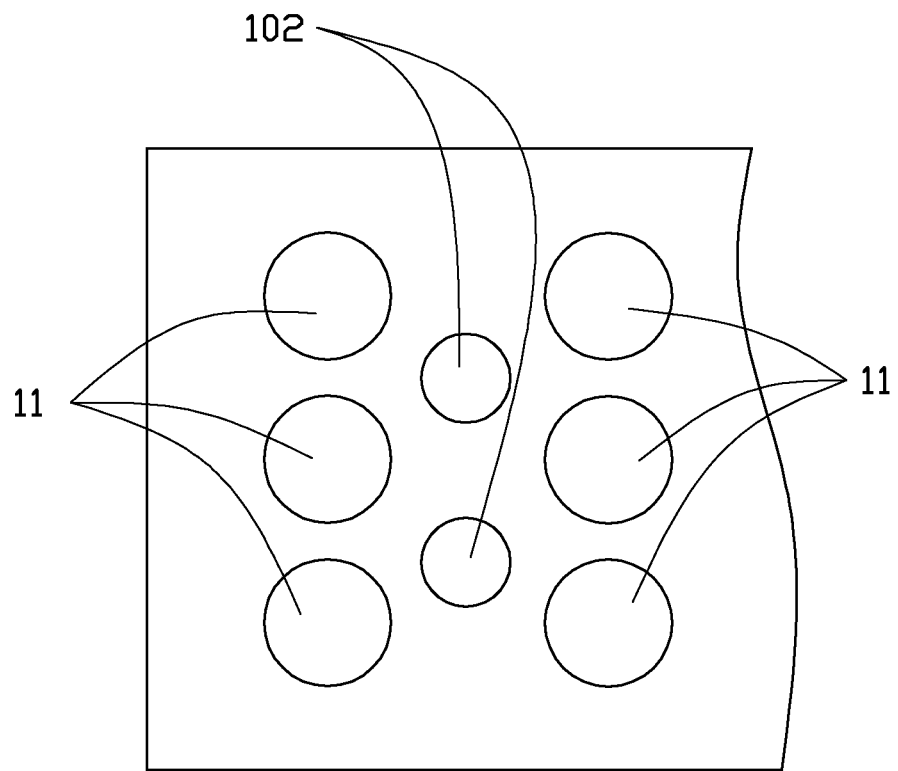

The first conductive vias 11A are arranged like that in FIG. 5. The filling through hole 102A is arranged between the first conductive vias 11A. The number of the through holes 102A may be one (arranged same to that of FIG. 5), two (arranged same to that of FIG. 6) or more than two. The shape of the through holes 102A may be circle, oval, rectangle, polygon, or irregular shape.

Figure 14:
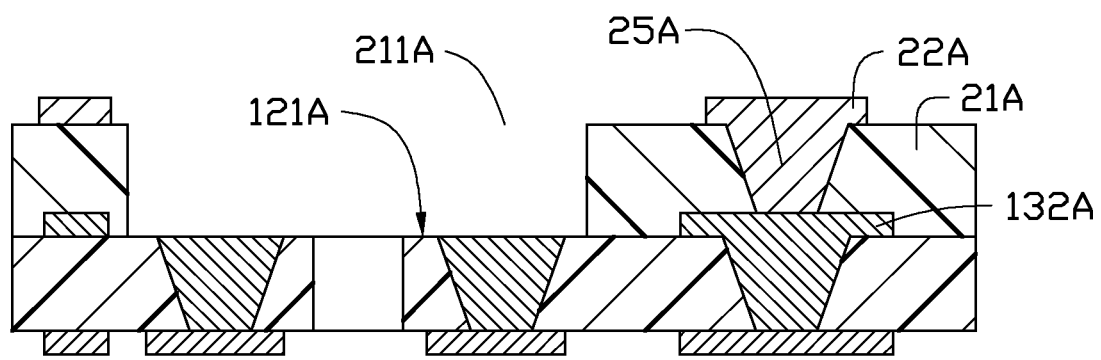
FIG. 14 shows insulating layer and circuit layer formed on the one side of the double-sided copper clad lamination of FIG. 13.

FIG. 14 show that in step 3, a first insulating layer 21A and a third wiring layer 22A are formed on the first surface 121A in described order. An opening 211A is defined to pass through the first insulating layer 21. The end of the first conductive vias 11A and the filling through hole 102A are exposed from the opening 211A. Accordingly, a double-sided printed circuit board 17A is obtained.

The first insulating layer 21A usually is adhesive sheets, e.g. FR4 epoxy glass cloth half-cured adhesive sheets. The first insulating layer 21A and a third wiring layer 22A may be formed by lamination.

A step of forming a plurality of second conductive vias 25A may be processed before the steps of forming the third wiring layer 22A. The second conductive vias 25A may be formed by a mechanical drilling or a laser drilling process and then by an electroplating or a via filling process. The via filling process may be a plating process, or a copper paste filling process, or a silver paste filling process. The third wiring layer 22A may be formed by an image transfer process and an etching process. The third wiring layer 22A is electrically connected to the first wiring layer 132A through the second conductive vias 25A.

Figure 15:
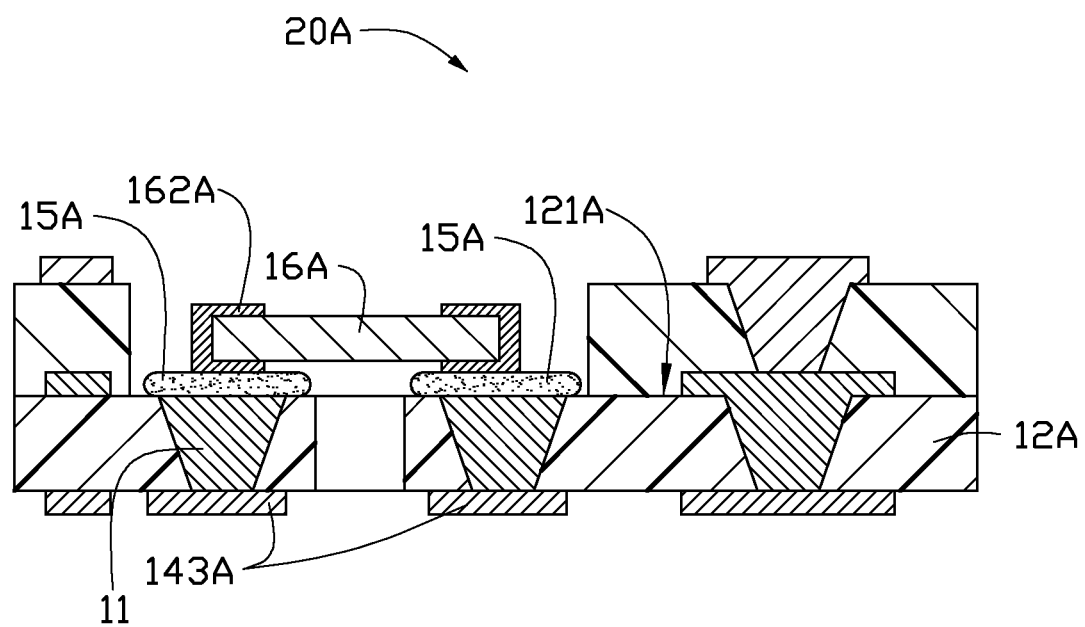
FIG. 15 shows an electronic component arranged on the double-sided copper clad lamination of FIG. 14 to obtain a multilayer substrate.

FIG. 15 shows that in step 4, a plurality of conductive paste blocks 15A is formed on the first surface 121A. Each conductive pastes block 15A is aligned with one corresponding electrical contact pads 143A. Each of the conductive paste blocks 15A covers and is electrically connected to one end of the first conductive via 11A electrically connected to the corresponding electrical contact pad 143A. A plurality of electronic components 16A is provided. The electronic components 16A are electrically connected to the conductive paste blocks 15A. Accordingly, a multilayer substrate 20A is obtained.

In the present embodiment, the electronic components 16A may be passive elements or active elements, (e.g. chips, resistors, or capacitors) which include two electrodes 162A. When the electronic component 16A is arranged on the conductive paste blocks 15A, the two electrodes 162A are respectively fixed and connected to the corresponding two conductive paste blocks 15A. The material of the conductive paste blocks 15A can be conductive solder paste, conductive silver paste, or conductive copper paste, for example.

In other embodiments, the step of forming the conductive paste blocks 15A may be processed before the steps of forming the first insulating layer 21A.

Figure 16:
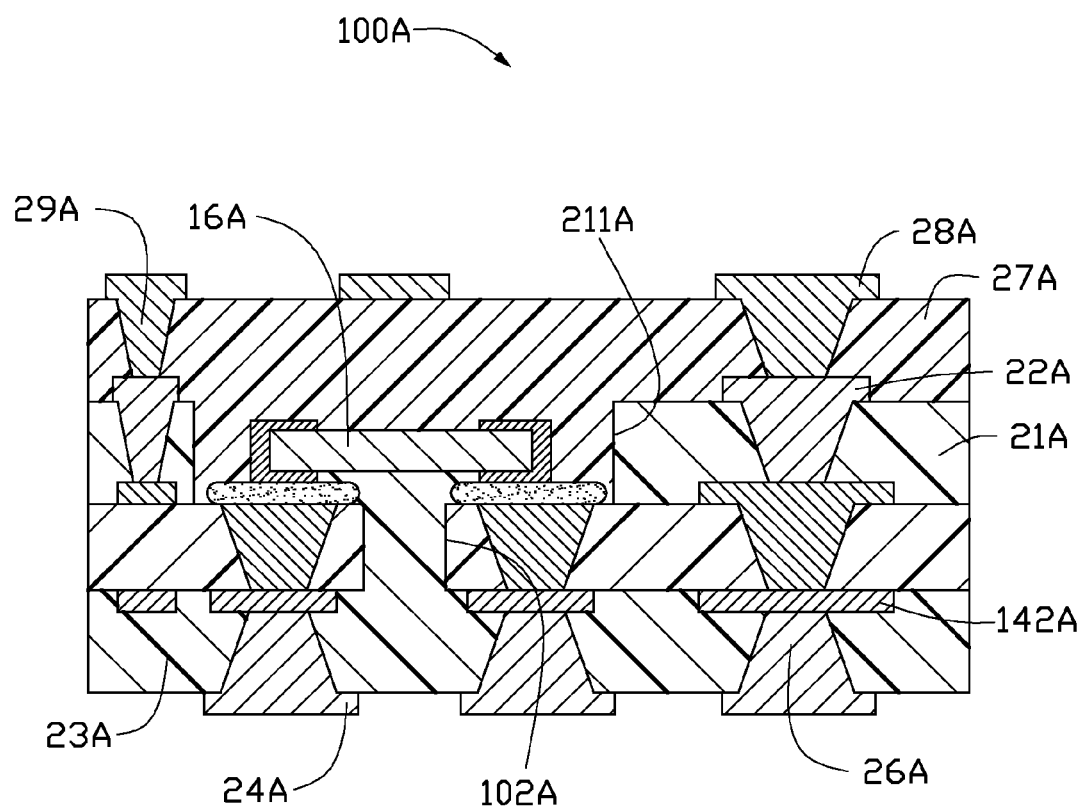
FIG. 16 shows insulating layers and circuit layers formed on the opposite side of the multilayer substrate of FIG. 15 to obtain a printed circuit board with embedded component.

FIG. 16 shows that in step 5, a second insulating layer 23A and a fourth wiring layer 24A are formed on the second wiring layer 142A in described order. A third insulating layer 27A and a fifth wiring layer 28A are formed on the third wiring layer 22A in described order. Accordingly, a printed circuit board with embedded component 100A is obtained.

The following steps may be used to form the second insulating layer 23A, the fourth wiring layer 24A, the third insulating layer 27A, and the fifth wiring layer 28A.

First, a fifth copper layer (not shown), the third insulating layer 27A, the multilayer substrate 20A, the second insulating layer 23A, and a fourth copper layer (not shown) are stacked, and laminated onto each other to form a main body.

The second insulating layer 23A and the third insulating layer 27A usually are adhesive sheets, e.g. FR4 epoxy glass cloth half-cured adhesive sheets. After lamination, the second insulating layer 23A covers the second wiring layer 142A and exposed portions of the second surface 122A, then enters into sides of the electronic components 16A adjacent to the first surface 121A through the filling through hole 102A, and fills into gaps between the electronic components 16A and the first surface 121. After the lamination is completed, the second insulating layer 23A fully fills the filling through hole 102A and the gaps between the electronic components 16A and the first surface 121A. The third insulating layer 27A covers the third wiring layer 22A, exposed surface of the first insulating layer 21A and the surface of the electronic components 16A, and fills into gaps between the electronic components 16A and the first insulating layer 21A.

Second, a plurality of third conductive vias 26A are formed in the second insulating layer 23A, a plurality of fourth conductive vias 29A are formed in the third insulating layer 27A, and the fourth copper layer and the fifth copper layer are respectively converted into the fourth wiring layer 24A and the fifth wiring layer 28A. The fourth wiring layer 24A is electrically connected to the second wiring layer 142A through the third conductive vias 26A. The fifth wiring layer 28A is electrically connected to the third wiring layer 22A through the fourth conductive vias 29A. The steps of forming the third conductive vias 26A and the fourth conductive vias 29A may be processed before the steps of forming the fourth wiring layer 24A and the fifth wiring layer 28A. The third conductive vias 26A and the fourth conductive vias 29A may be formed by a mechanical drilling or a laser drilling process and then by an electroplating or a via filling process. The hole filling process may be a plating process, or a copper paste filling process, or a silver paste filling process. The fourth wiring layer 24A and the fifth wiring layer 28A may be formed by an image transfer process and an etching process.

There may be two or more wiring layers formed at the side of the fourth wiring layer 24A, and there may be two or more wiring layers formed at the side of the fifth wiring layer 28A.

The printed circuit board with embedded component 100A in the present embodiment is similar to the printed circuit board with embedded component 100 in the first embodiment. The differences include the following items. The printed circuit board with embedded component 100A further includes the third insulating layer 27A, the fifth wiring layer 28A. The opening 211A is defined to pass through the first insulating layer 21A. The electronic component 16 is embedded in the opening 16A. One end of the first conductive vias 11A are exposed from the opening 211A. The electronic components 16A are electrically connected to the end of the first conductive via 11A through the conductive paste blocks 15A. The third insulating layer 27A covers the third wiring layer 22A, exposed surface of the first insulating layer 21A and the surface of the electronic components 16A, and fully fills gaps between the electronic components 16A and the first insulating layer 21A. The fifth wiring layer 28A is formed on the surface of the third insulating layer 27A further away from the third wiring layer 22A.

It is understood that the number of the electronic components 16A may be more than or less than 3. In such case, the number of the conductive paste blocks 15A, the number of the electrical contact pads 143A, and the number of the first conductive vias 11A should be changed to match with the number of the electronic components 16A.

In the method for making the printed circuit board with embedded component 100, 100A, the first conductive vias 11, 11A corresponding to the electronic components 16, 16A are formed first, and then the conductive paste blocks 15, 15A are formed on the ends of the first conductive vias 11, 11A to electrically connect the electronic components 16, 16A to the printed circuit board with embedded component 100, 100A. Accordingly, avoiding an alignment between the electronic components 16, 16A and the first conductive vias 11, 11A. In addition, because there is no alignment, there is no need to use an expensive arrangement machine to arrange the electronic components on the multilayer substrate 20, 20A. The cost of the printed circuit board with embedded component 100, 100A is lowered.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A method for manufacturing a printed circuit board with an embedded component, comprising:

providing a double-sided printed circuit board, the double-sided printed circuit board comprising a base, a first wiring layer and a second wiring layer, the base including a first surface and a second surface opposite to the first surface, the first wiring layer and the second wiring layer being respectively arranged on the first surface and the second surface, the second wiring layer comprising a plurality of electrical contact pads, and a plurality of conductive vias being formed in the base, each electrical contact pad aligned with one corresponding conductive via, and electrically connected to an end of the corresponding conductive via, the other ends of the conductive vias being co-planar or lower than to the first surface, and a filling through hole passing through the base, and the filling through hole being apart from the conductive vias and between the conductive vias;

forming a plurality of conductive paste blocks on the first surface, and directly electrically connecting each conductive paste block to one of the conductive vias;

providing an electronic component, and arranging the electronic component on surfaces of the conductive paste blocks facing away from the conductive vias to electrically connect the electronic component to the conductive paste blocks;

forming a first insulating layer including a third wiring layer on the first wiring layer and forming a second insulating layer including a fourth wiring layer on the second wiring layer in described order, such that the first insulating layer formed on the first wiring layer covers the electronic component, the second insulating layer formed on the second wiring layer covers the second wiring layer and fully fills into the filling through hole and the gaps between the electronic component and the base, forming an opening pass through the first insulating layer, first conductive vias of the plurality of conductive vias being exposed from the opening; and the plurality of conductive paste blocks formed in the opening each conductive pastes block aligned with one corresponding electrical contact pad, the electronic component being arranged in the opening;

forming a third insulating layer, the third insulating layer covering the third wiring layer and the electronic components, and filling gaps between the electronic components and the first insulating layer, thereby obtaining a printed circuit board with embedded component.

2. The method of claim 1, wherein the plurality of conductive paste blocks are made of a material selected from a group consisting of conductive solder paste, conductive silver paste, and conductive copper paste.

3. A printed circuit board with embedded component, comprising:

a double-sided printed circuit board,
the double-sided printed circuit board comprising
a first wiring layer, a base, and a second wiring layer,
the base including a first surface and a second surface opposite to the first surface, the first wiring layer and the second wiring layer being respectively arranged on the first surface and the second surface of the base,
the second wiring layer comprising a plurality of electrical contact pads, and a plurality of conductive vias being formed in the base,
each electrical contact pad aligned with one corresponding conductive via, and electrically connected to an end of the corresponding conductive via, the other ends of the conductive vias being co-planar or lower than to the first surface, and
a filling through hole passing through the base apart from the conductive vias and being between the conductive vias;
an electronic component and a plurality of conductive paste blocks, the conductive paste blocks respectively directly electrically connected to the conductive vias, the electronic component being adhered to and electrically connected to surfaces of the conductive paste blocks facing away from the conductive vias;
a first insulating layer including a third wiring layer formed on the first wiring layer, a second insulating layer including a fourth wiring layer formed on the second wiring layer, the first insulating layer formed on the first wiring layer covering the electronic component, the second insulating layer formed on the second wiring layer covering the second wiring layer and fully filling into the filling through hole and gaps between the electronic component and the base,
an opening being defined to pass through the first insulating layer and the first insulating layer, the first conductive vias being exposed from the opening, the conductive paste blocks and the electronic component being formed in the opening, and
a third insulating layer, the third insulating layer covering the third wiring layer and the electronic components, and filling gaps between the electronic components and the first insulating layer, thereby obtaining a printed circuit board with embedded component.

4. The printed circuit board with embedded component of claim 3, wherein the plurality of conductive paste blocks are made of a material selected from a group consisting of conductive solder paste, conductive silver paste, and conductive copper paste.

* * * * *